United States Patent
Dray

(10) Patent No.: US 6,639,270 B2
(45) Date of Patent: Oct. 28, 2003

(54) NON-VOLATILE MEMORY CELL

(75) Inventor: Cyrille Dray, La Cote St Andre (FR)

(73) Assignee: STMicroelectronics SA, Montrouge (FR)

( * ) Notice: Subject to any disclaimer, the term of this patent is extended or adjusted under 35 U.S.C. 154(b) by 58 days.

(21) Appl. No.: 09/921,280

(22) Filed: Aug. 2, 2001

(65) Prior Publication Data

US 2002/0050610 A1 May 2, 2002

(30) Foreign Application Priority Data

Aug. 3, 2000 (FR) .......................................... 00 10287

(51) Int. Cl.[7] .......................................... H01L 29/788
(52) U.S. Cl. ..................... 257/317; 257/316; 257/401; 257/490; 257/315; 257/321; 438/257; 438/264; 438/265
(58) Field of Search ................................. 257/317, 316, 257/401, 490, 315, 321; 438/257, 264, 265

(56) References Cited

U.S. PATENT DOCUMENTS

| | | | | |
|---|---|---|---|---|
| 4,942,450 A | * | 7/1990 | Iwashita ...................... 257/323 |
| 5,440,510 A | * | 8/1995 | Caprara et al. ........ 365/185.04 |
| 5,510,639 A | * | 4/1996 | Okuda et al. ................ 257/317 |
| 6,433,382 B1 | * | 8/2002 | Orlowski et al. ........... 257/315 |
| 6,459,121 B1 | * | 10/2002 | Sakamoto et al. .......... 257/315 |

FOREIGN PATENT DOCUMENTS

EP 0609829 8/1994 ......... H01L/29/788

OTHER PUBLICATIONS

Frohman–Bentchkowsky: "FAMOS—A New Semiconductor Charge Storage Device" Solid–State Electronics, vol. 17, No. 6, Jun. 1974, pp. 517–529, XP002165658, Elsevier Science Publishers, GB ISSN: 0038–1101.

Patent Abstracts of Japan, vol. 018, No. 556 (E–1620), Oct. 24, 1994, JP06204468A (Nippon Steel Corp.), Jul. 22, 1994.

* cited by examiner

*Primary Examiner*—Matthew Smith
*Assistant Examiner*—V. Yevsikov
(74) *Attorney, Agent, or Firm*—Lisa K. Jorgenson; Allen, Dyer, Doppelt, Milbrath & Gilchrist, P.A.

(57) ABSTRACT

A non-volatile memory cell includes a MOS transistor having a ring arrangement and comprising a floating gate, a center electrode at a center of the ring arrangement and surrounding the floating gate, and at least one peripheral electrode along a periphery of the ring arrangement.

28 Claims, 2 Drawing Sheets

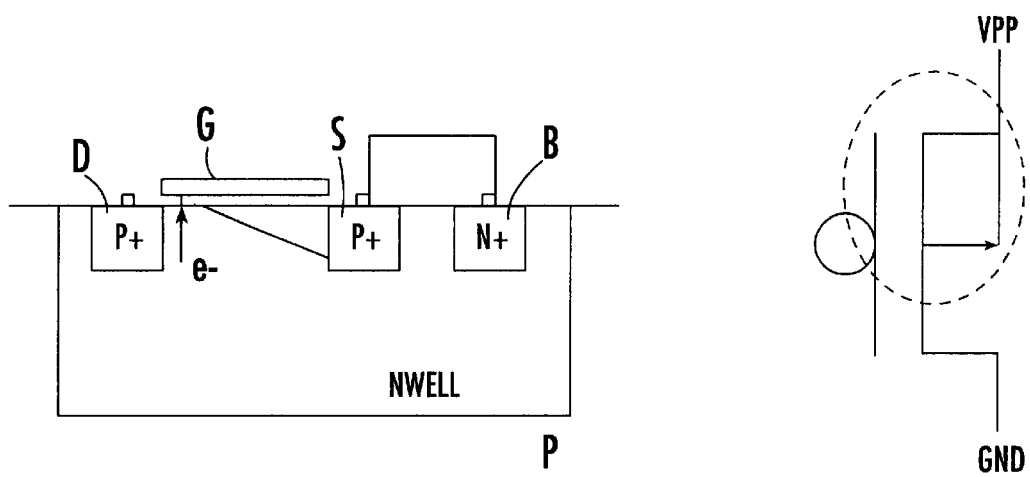
FIG. 1a.
PRIOR ART
FIG. 1b.
PRIOR ART
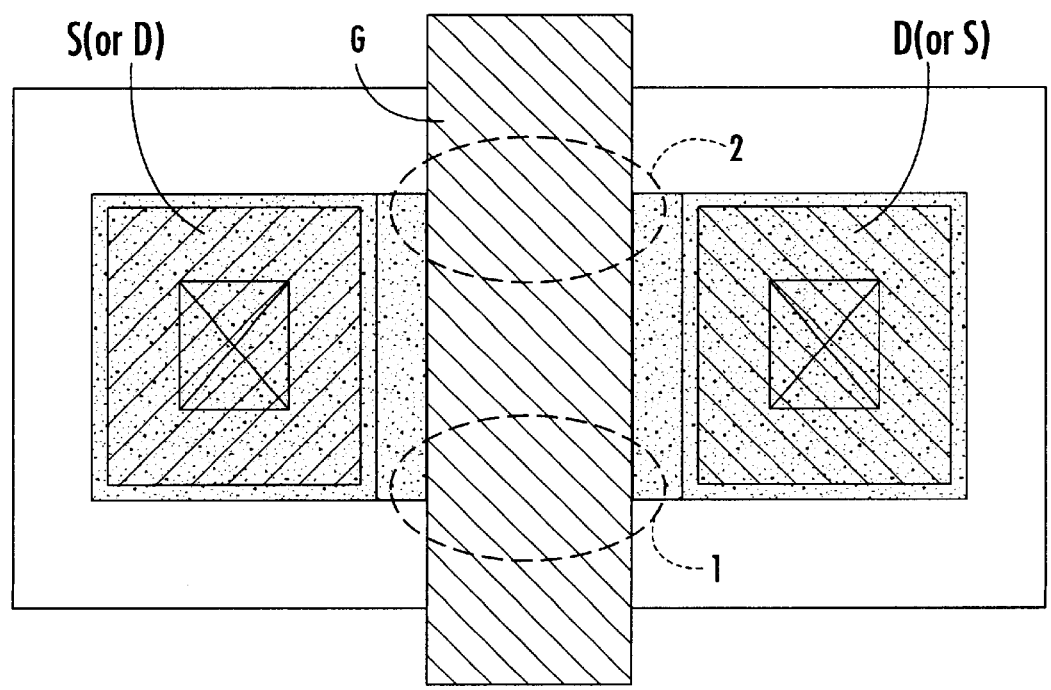
FIG. 2.
PRIOR ART

NON-VOLATILE MEMORY CELL

FIELD OF THE INVENTION

The present invention relates to integrated circuits, and more particularly, to an integrated circuit including a non-volatile memory cell based on a floating-gate avalanche injection metal oxide silicon (FAMOS) type transistor.

BACKGROUND OF THE INVENTION

Floating-gate avalanche injection metal oxide silicon (FAMOS) technology uses the natural memory cell obtained with a P-type MOS transistor whose single gate is insulated or electrically unconnected. This gate is therefore a floating gate.

This memory cell is called a natural memory cell because it is obtained without the addition of supplementary steps to the basic method of manufacturing a P-type MOS transistor. In particular, the memory cell has only one polysilicon level, unlike other known memory cells, for example EPROM or EEPROM type memory cells which usually have two of them. On the other hand, since the gate is electrically unconnected, it is not possible to electrically erase this memory cell. UV rays have to be used. This type of memory cell is therefore more particularly used as a one-time programmable (OTP) memory.

A diagrammatic view of a memory cell of this kind is shown in FIG. 1a. In the example, the memory cell comprises a P-type MOS transistor with a gate G, a drain D and a source S. The memory cell is made in an N-type well on a P-type substrate. It therefore has a bulk connector B connected in a conventional way to the source S to eliminate the substrate effect. The only difference between the FAMOS memory cell and a usual P-type MOS transistor is that its single gate G is not electrically connected, and is therefore a floating gate.

The programming of the memory cell is obtained by hot electrons. The electrical diagram corresponding to the programming operation is shown in FIG. 1b. A programming voltage VPP is applied to the source S, and ground GND is applied to the drain D. The potential of the gate G rises by capacitive coupling with the source and the bulk connection. Hot electrons are then created at the drain and injected into the gate.

In the blank state or the state in which the memory cell is erased by ultraviolet rays, a FAMOS memory cell has a threshold voltage of about −0.6 V. When programmed, this threshold voltage goes to about 1 V. Putting into effect new options of technological methods for non-volatile memories is highly costly in terms of development and testing. It is therefore especially useful to be able to integrate functions based on natural elements, directly resulting from the technology concerned and especially memory functions.

A common problem with non-volatile memories lies in their data retention. The retention of data in a FAMOS memory cell may be affected by spikes at the interface between the gate and the insulator formed around the transistor, so that the other active elements made in the substrate are insulated.

This problem is recalled with reference to FIG. 2, which shows a diagrammatic view of an arrangement of the PMOS transistor forming a FAMOS memory cell in a P-type substrate. Conventionally, the drain diffusion zone D and source diffusion zone S are made in an N-type well and aligned with the polysilicon gate G in the transversal direction.

Usually, the different active elements of the substrate are insulated by field oxide. The memory cell is thus insulated from the other active elements of the integrated circuit by the field oxide all round the transistor delimited by the well.

Various techniques are used to make this field oxide. These techniques include LOCOS or STI (shallow trench insulation) which gives a thinner surface oxide thickness. The interfaces 1 and 2 of this field oxide with the gate G are brittle zones of the structure due to the differences in height between the elements.

The mechanical constraints in these zones 1, 2 may locally modify characteristics of the gate oxide of the memory cell and promote a loss of charges. For these reasons, the FAMOS memory cell does not offer a truly satisfactory data retention period.

SUMMARY OF THE INVENTION

In view of the foregoing background, it is an object of the invention to use the natural memory cell as a non-volatile memory cell in an integrated circuit.

Another object of the invention is to provide a FAMOS memory cell with improved data retention.

These and other objects, advantages and features of the invention are obtained by a ring arrangement of the memory cell, so that one of the electrodes is at the center and the other electrode is at the periphery. The gate is then inside the volume delimited by the peripheral electrode. The field oxide is outside the volume delimited by the peripheral electrode.

The invention therefore relates to a non-volatile memory cell comprising a P-type MOS transistor whose single gate is not electrically connected, and wherein this transistor has a ring arrangement. The invention also relates to an integrated circuit comprising at least one non-volatile memory cell of this type.

BRIEF DESCRIPTION OF THE DRAWINGS

Other features and advantages of the invention are given in detail in the following description, made by way of a non-restrictive indication with reference to the appended drawings, of which:

FIGS. 1a, 1b and 2 respectfully show a conventional FAMOS transistor, a corresponding electrical diagram and a diagrammatic arrangement according to the prior art;

DETAILED DESCRIPTION OF THE PREFERRED EMBODIMENTS

Reference is made hereinafter to a FAMOS transistor. This expression must be understood to mean a P-type MOS transistor whose single gate is not electrically connected.

Figure 3:
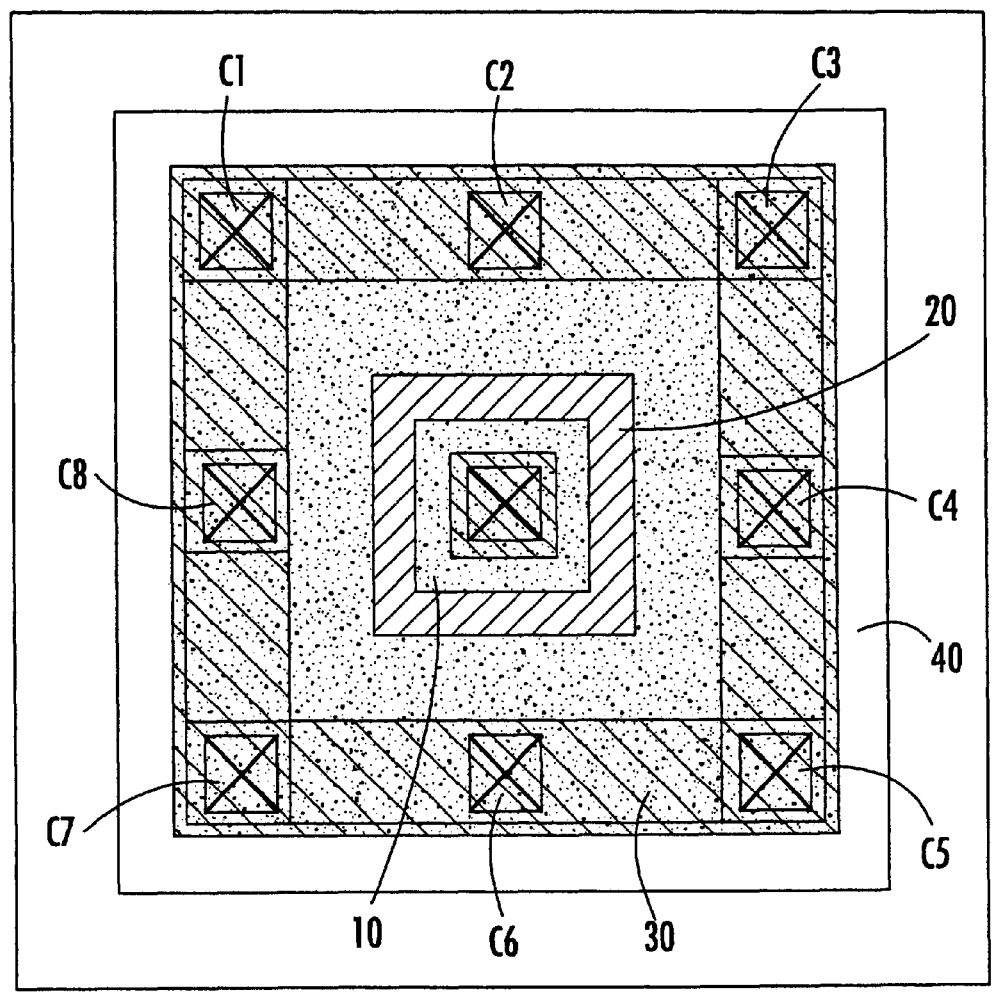
FIG. 3 shows an arrangement of a non-volatile memory cell according to the present invention.

FIG. 3 shows a ring arrangement of a FAMOS transistor on a P-type substrate. The invention may also be applied to an arrangement on an N-type substrate. In this arrangement, a central diffusion zone 10 and a peripheral diffusion zone 30 are made. The polysilicon gate 20 is in the volume delimited by the two diffusion zones 10, 30. The field oxide 40 surrounds the peripheral diffusion zones 30.

A ring arrangement of this kind requires no additional manufacturing step, and the difference between the usual straight or linear arrangement and the ring arrangement lies in the designing of the different elements. However, this arrangement is costlier in terms of space. In one example, in a given technology the minimum W/L geometry of the MOS transistor with a conventional linear arrangement is 0.8 microns by 0.35 microns. With a ring arrangement, the minimum geometry is 5.8 microns by 0.35 microns.

In the ring arrangement, it is moreover preferable to make at least two contact points on the peripheral diffusion zone 30 to reduce the access resistance of the ring-like diffusion zone. Preferably, and as shown in FIG. 3, several contact points C1 to C8 are planned. In the example, these points are distributed throughout the surface of this zone.

Advantageously, the ring arrangement can be used to obtain far better performance from the non-volatile memory cell with a FAMOS transistor, especially with regards to data retention. With the ring arrangement, the gate 20 which is not connected is confined within a volume inside the peripheral diffusion zone 30. Thus, the gate 20 is confined to the interior of the very structure of the FAMOS memory cell, and there is no longer any interface between the gate and the field oxide.

Furthermore, owing to the ring arrangement, the peripheral electrode 30 has a far greater surface area than the central electrode 10. If the peripheral electrode 30 is taken as the source S, and the central electrode 10 is taken as the drain D, the gate-source capacitive coupling is promoted to the detriment of the gate/drain capacitive coupling. This gives a higher gate potential in the programming phase. Thus, the programming is faster and the quantity of charges injected into the gate is greater. The programming level is therefore better, thus improving the data retention.

In practice, the capacitive coupling between the gate and the source is 58 percent higher than the capacitive coupling between the gate and the drain. A FAMOS memory cell with a ring arrangement according to the invention provides a storage function in integrated circuits without development costs. The trade-off here is a fairly large surface area of memory cell which, however, can be accepted in applications that do not require a large memory capacity.

With a memory cell according to the invention, it is possible to provide a low-cost memory function in an integrated circuit. Should several memory cells be designed, it is necessary to provide for at least one selection transistor (not shown) associated with each memory cell used to selectively program or read this memory cell.

Figure 4:
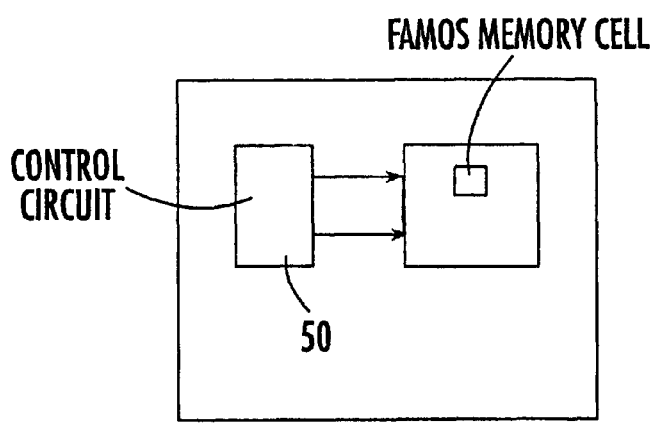
FIG. 4 is a diagrammatic view of an integrated circuit comprising at least one non-volatile memory cell.

A corresponding integrated circuit is shown diagrammatically in FIG. 4. This circuit has at least one FAMOS memory cell C1. A control circuit 50 is provided for selecting and applying the programming or read voltages to a selected FAMOS memory cell.

That which is claimed is:

1. A non-volatile memory cell comprising:
   a MOS transistor having a ring arrangement and comprising
   a center electrode at a center of the ring arrangement,
   a floating gate surrounding said center electrode,
   at least one peripheral electrode along a periphery of the ring arrangement, and
   said center electrode, said floating gate and said at least one peripheral electrode being arranged so that programming is performed by applying a first voltage reference to said center electrode and a second voltage reference to said at least one peripheral electrode so that capacitive coupling with said floating gate causes a charge to be injected therein.

2. A non-volatile memory cell according to claim 1 wherein said MOS transistor comprises a semiconductor layer; an wherein said center electrode is defined by a central diffusion region in said semiconductor layer at the center of the ring arrangement, and said at least one peripheral electrode is defined by a peripheral diffusion region in said semiconductor layer along the periphery of the ring arrangement.

3. A non-volatile memory cell according to claim 2, further comprising a dielectric layer surrounding said peripheral diffusion region.

4. A non-volatile memory cell according to claim 1, wherein said center electrode is a drain electrode, and said at least one peripheral electrode is a source electrode.

5. A non-volatile memory cell according to claim 1, wherein said at least one peripheral electrode comprises a plurality of contact points.

6. A non-volatile memory cell according to claim 1, wherein said MOS transistor comprises a P-type MOS transistor.

7. A non-volatile memory cell according to claim 1, wherein said MOS transistor is configured as a floating-gate avalanche injection metal oxide silicon (FAMOS) transistor.

8. A non-volatile memory comprising:
   a substrate of a first conductivity type,
   a plurality of non-volatile memory cells, with each memory cell comprising a MOS transistor having a ring arrangement in said substrate and comprising
   a central diffusion region of a second conductivity type in said substrate at a center of the ring arrangement for defining a center electrode;
   a floating date surrounding said center electrode;
   a peripheral diffusion region of the second conductivity type in said substrate along a periphery of the ring arrangement for defining at least one per peripheral electrode; and
   said center electrode, said floating gate and said at least one peripheral electrode being arranged so that programming is performed by applying a first voltage reference to said center electrode and a second voltage reference to said at least one peripheral electrode so that capacitive coupling with said floating gate causes a charge to be injected therein.

9. A non-volatile memory according to claim 8, further comprising a dielectric layer surrounding said peripheral diffusion region.

10. A non-volatile memory according to claim 8, wherein said center electrode is a drain electrode, and said at least one peripheral electrode is a source electrode.

11. A non-volatile memory according to claim 8, wherein said at least one peripheral electrode comprises a plurality of contact points.

12. A non-volatile memory according to claim 8, wherein the first type of conductivity comprises a P-type conductivity, and the second type of conductivity comprises an N-type conductivity.

13. A non-volatile memory according to claim 8, wherein the first type of conductivity comprises an N-type conductivity, and the second type of conductivity comprises P-type conductivity.

14. A non-volatile memory according to claim 8, wherein said MOS transistor is configured as a floating-gate avalanche injection metal oxide silicon (FAMOS) transistor.

15. An integrated circuit comprising:
   at least one non-volatile memory comprising a plurality of non-volatile memory cells, each memory cell comprising at least one MOS transistor having a ring arrangement and comprising
   a center electrode at a center of the ring arrangement;

a floating gate surrounding said center electrode;

at least one peripheral electrode along a periphery of the ring arrangement; and said center electrode, said floating gate and said at least one peripheral electrode being arranged so that programming is performed by applying a first voltage reference to said center electrode and a second voltage reference to said at least one peripheral electrode so that capacitive coupling with said floating gate causes a charge to be injected therein.

16. An integrated circuit according to claim 15, wherein said at least one MOS transistor comprises a semiconductor layer; and wherein said center electrode is defined by a central diffusion region in said semiconductor layer at the center of the ring arrangement, and said at least one peripheral electrode is defined by a peripheral diffusion region in said semiconductor layer along the periphery of the ring arrangement.

17. An integrated circuit according to claim 16, further comprising a dielectric layer surrounding said peripheral diffusion region.

18. An integrated circuit according to claim 15, wherein said center electrode is a drain electrode, and said at least one peripheral electrode is a source electrode.

19. An integrated circuit according to claim 15, wherein said at least one peripheral electrode comprises a plurality of contact points.

20. An integrated circuit according to claim 15, wherein said at least one MOS transistor comprises a P-type MOS transistor.

21. An integrated circuit according to claim 15, wherein said at least one MOS transistor is configured as a floating-gate avalanche injection metal oxide silicon (FAMOS) transistor.

22. An integrated circuit according to claim 15, further comprising a control circuit connected to said at least one non-volatile memory for applying at least one of a programming and a read voltage to a selected memory cell.

23. A method for making a non-volatile memory cell comprising at least one MOS transistor having a ring arrangement, the method comprising:

forming a central diffusion region in a semiconductor layer at a center of the ring arrangement for defining a center electrode;

forming a floating date surrounding the center electrode;

forming a peripheral diffusion region in the semiconductor layer along a periphery of the ring arrangement for defining at least one peripheral electrode; and the center electrode, the floating gate and the at least one peripheral electrode being arranged so that programming is perform by applying a first voltage reference to the center electrode and a second voltage reference to the at least one peripheral electrode so that capacitive coupling with the floating gate causes a charge to be injected therein.

24. A method according to claim 23, further comprising forming a dielectric layer surrounding the peripheral diffusion region.

25. A method according to claim 23, wherein the center electrode is a drain electrode, and the at least one peripheral electrode is a source electrode.

26. A method according to claim 23, wherein the at least one peripheral electrode comprises a plurality of contact points.

27. A method according to claim 22, wherein the MOS transistor comprises a P-type MOS transistor.

28. A method according to claim 23, wherein the MOS transistor is configured as a floating-gate avalanche injection metal oxide silicon (FAMOS) transistor.

* * * * *

UNITED STATES PATENT AND TRADEMARK OFFICE
CERTIFICATE OF CORRECTION

PATENT NO. : 6,639,270 B1
DATED : October 28, 2003
INVENTOR(S) : Cyrille Dray

It is certified that error appears in the above-identified patent and that said Letters Patent is hereby corrected as shown below:

Column 4,
Line 1, delete "an" insert -- and --
Line 30, delete "date" insert -- gate --

Column 6,
Line 9, delete "date" insert -- gate --
Line 15, delete "perform" insert -- performed --

Signed and Sealed this

Twenty-second Day of June, 2004

JON W. DUDAS
*Acting Director of the United States Patent and Trademark Office*